(12) United States Patent
Kim

(10) Patent No.: US 6,853,050 B2
(45) Date of Patent: Feb. 8, 2005

(54) SEMICONDUCTOR DEVICE WITH FUSE BOX AND METHOD FOR FABRICATING THE SAME

(75) Inventor: Hyun-Chul Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/397,905

(22) Filed: Mar. 25, 2003

(65) Prior Publication Data

US 2003/0189244 A1 Oct. 9, 2003

(30) Foreign Application Priority Data

Apr. 4, 2002 (KR) .................. 10-2002-0018540

(51) Int. Cl.[7] .......... H01L 29/00; H01L 23/48; H01L 23/52; H01L 29/40

(52) U.S. Cl. ........................ 257/529; 257/758
(58) Field of Search ................ 257/529–532, 257/758

(56) References Cited

U.S. PATENT DOCUMENTS 6,242,789 B1 * 6/2001 Weber et al. ............ 257/529

* cited by examiner

*Primary Examiner*—Cuong Nguyen
(74) *Attorney, Agent, or Firm*—Marger Johnson & McCollom PC

(57) ABSTRACT

A semiconductor device comprises a semiconductor substrate having a bonding pad region; and a bonding pad and a fuse box formed in the bonding pad region. Thus, the chip size can be reduced and the manufacturing yield can be increased.

7 Claims, 7 Drawing Sheets

SEMICONDUCTOR DEVICE WITH FUSE BOX AND METHOD FOR FABRICATING THE SAME

This application claims priority from Korean Patent Application No. 10-2002-18540, filed on Apr. 4, 2002, the contents of which are incorporated herein by reference in their entirety.

BACKGROUND OF THE INVENTION

1. Field of the Invention

The present invention relates to a semiconductor device and, more particularly, to a semiconductor device with a fuse box and a method for fabricating the same.

2. Description of Related Art

The more the manufacturing technology of semiconductor devices improves, the more a chip size of the semiconductor devices is reduced to incorporate as many chips as possible in a wafer.

Generally, the semiconductor device includes a bonding pad region, in which bonding pads are formed, and a fuse region, in which a fuse box, through which a fuse cutting process is performed, is formed. The bonding pad region and the fuse region have not been reduced in size in comparison to the chip size reduction.

FIGS. 1A to 1D illustrate a conventional method of forming a fuse box and a bonding pad in a fuse region and a bonding pad region, respectively.

Referring to FIG. 1A, a semiconductor substrate 100 has a fuse region 101 and a bonding pad region 102. A plurality of polysilicon fuses 110 are then formed in the fuse region 101. When a polysilicon layer is patterned in a memory cell region (not shown) to form a bit line, the fuses 110 may be formed concurrently in the fuse region 101.

A first interlayer insulating film 120 is formed on the semiconductor substrate 100 including the fuses 110, and an etching stop layer 130 comprised of polysilicon is sequentially formed on the first interlayer insulating film 120. The etching stop layer 130 may be formed simultaneously when a polysilicon layer for a capacitor plate is formed in the memory cell region.

Next, a second interlayer insulating film 140 is formed on the etch stop layer 130 and a first metal line 150 is sequentially formed in the bonding pad region 102 on the second interlayer insulating film 140.

Referring to FIG. 1B, a third interlayer insulating film 160 is formed over the metal line 150. Subsequently, the third interlayer insulating film 160 in the bonding pad region 102 is etched to form an opening 161 therein to expose a portion of the first metal line 150. Simultaneously, the third interlayer insulating film 160 and the second interlayer insulating film 140 in the fuse region 101 are etched to form a via hole 165 therein to expose a portion of the etching stop layer 130.

Next, a metal layer is deposited on the semiconductor substrate 100 and patterned to form a second metal line 170 in the bonding pad region 102. Also, a guard ring 175 is formed in the fuse region 101 in the via hole 165. The second metal line 170 is connected to the first metal line 150 via the opening 161.

Turning to FIG. 1C, a passivation layer 180 is formed on the semiconductor substrate 100.

Referring to FIG. 1D, the passivation layer 180 is etched to expose the second metal line 170, thereby forming a bonding pad opening 190 in the bonding pad region 102.

In addition, the passivation layer 180, the second and the third interlayer insulating films 140 and 160, and the etch stop layer 130 are sequentially etched to expose the first interlayer insulating film 120 over the fuses 110, thereby forming the fuse box 195 in the fuse region 101.

In the conventional semiconductor device described above, the bonding pad region and the fuse region are separately arranged in a peripheral region of the semiconductor substrate, which is an obstacle to reduction of the chip size.

SUMMARY OF THE INVENTION

In an effort to overcome the problems described above, it is a feature of an embodiment of the present invention to provide a semiconductor device with a bonding pad and a fuse box both of which are formed in a bonding pad region, capable of reducing the chip size and a method for fabricating the same.

In accordance with one aspect of the present invention, there is provided a semiconductor device with a bonding pad and a fuse box in a bonding pad region of a semiconductor substrate.

In accordance with another aspect of the present invention, a semiconductor device comprises a plurality of fuses formed in a bonding pad region of a semiconductor substrate; an insulation film overlying the fuses; a bonding pad overlying the insulation film in the bonding pad region; and a passivation layer formed in the insulation film and including a bonding pad opening to expose the bonding pad, wherein the bonding pad opening includes a fuse box to expose the insulation film over the fuses.

In accordance with yet another aspect of the present invention, a semiconductor device comprises a plurality of fuses formed in a bonding pad region of a semiconductor substrate; a first interlayer insulating film formed overlying the fuses; a first metal line and metal patterns formed on the first interlayer insulating film in the bonding pad region; a second interlayer insulating film formed on the metal patterns; a second metal line formed on the second interlayer insulating film over the first metal line; a passivation layer formed on the resulting structure and including a bonding pad opening to expose the second metal line; and a fuse box formed within the bonding pad opening to expose the first interlayer insulating film over the fuses.

In accordance with still further another aspect of the present invention, there is provided a method for manufacturing a semiconductor device. A plurality of fuses formed in a bonding pad region of a semiconductor substrate. An insulation film is formed overlying the plurality of fuses. A bonding pad is formed overlying the insulation film in the bonding pad region. A passivation layer is formed overlying the insulation film and including a bonding pad opening to expose the bonding pad. The bonding pad opening includes a fuse box to expose a portion of the insulation film covering the fuses.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

Figure 1A:
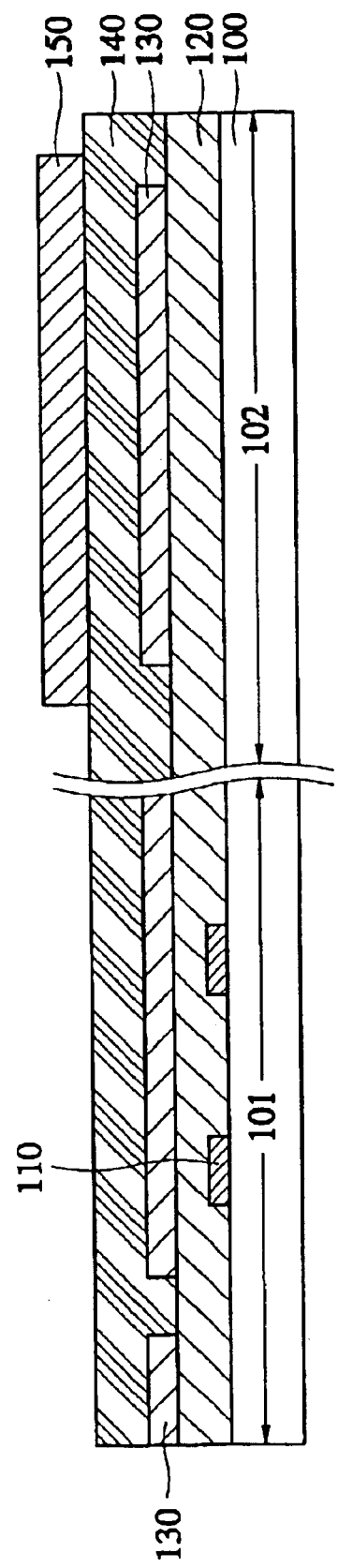
FIGS. 1A to 1D are cross-sectional views of a semiconductor device showing a method of forming a fuse box and a bonding pad in a fuse region and a bonding pad region, respectively, in accordance with the conventional art.
Figure 1B:
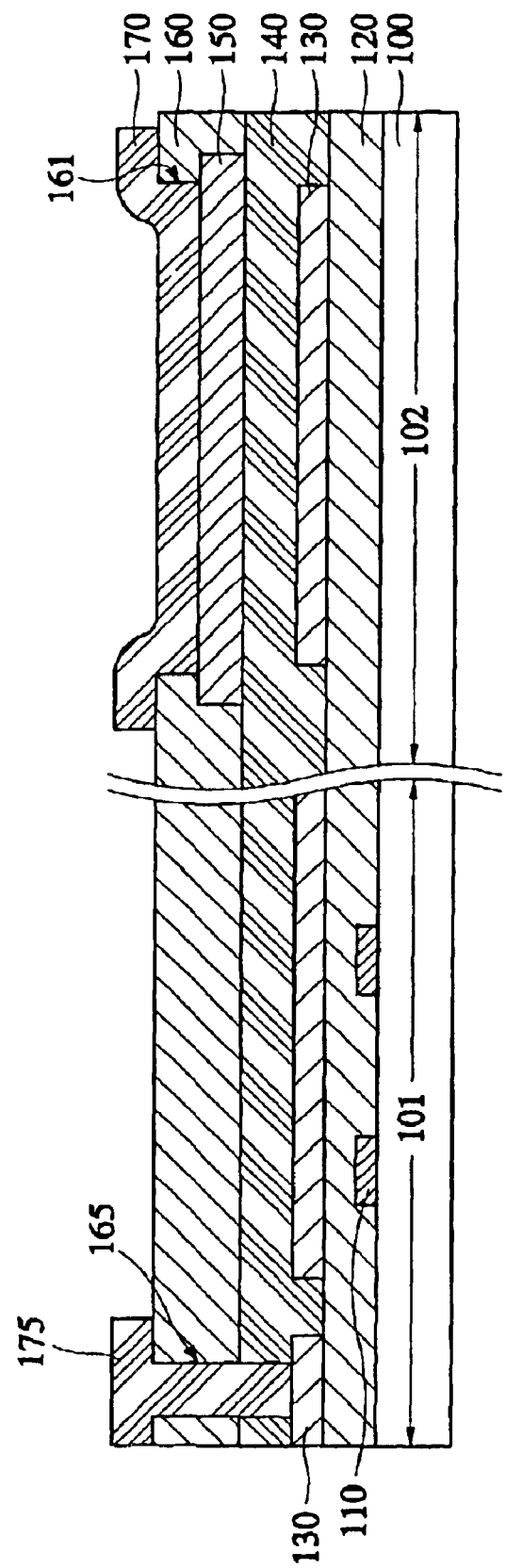
Figure 1C:
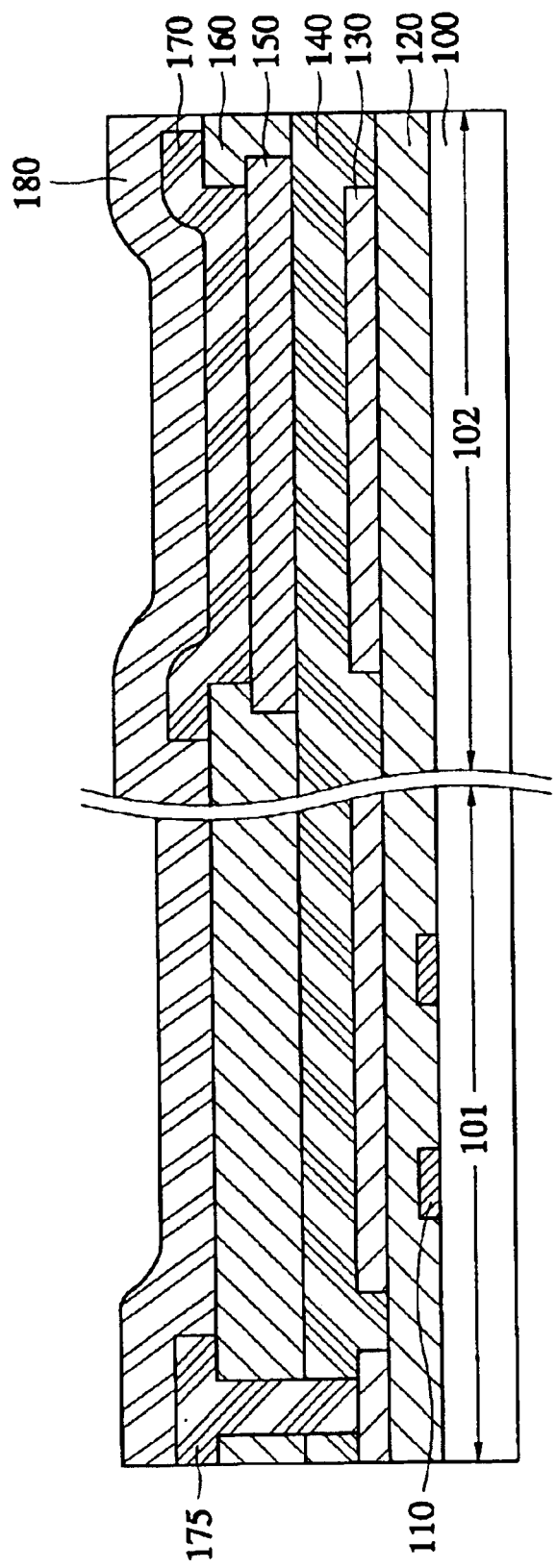
Figure 1D:
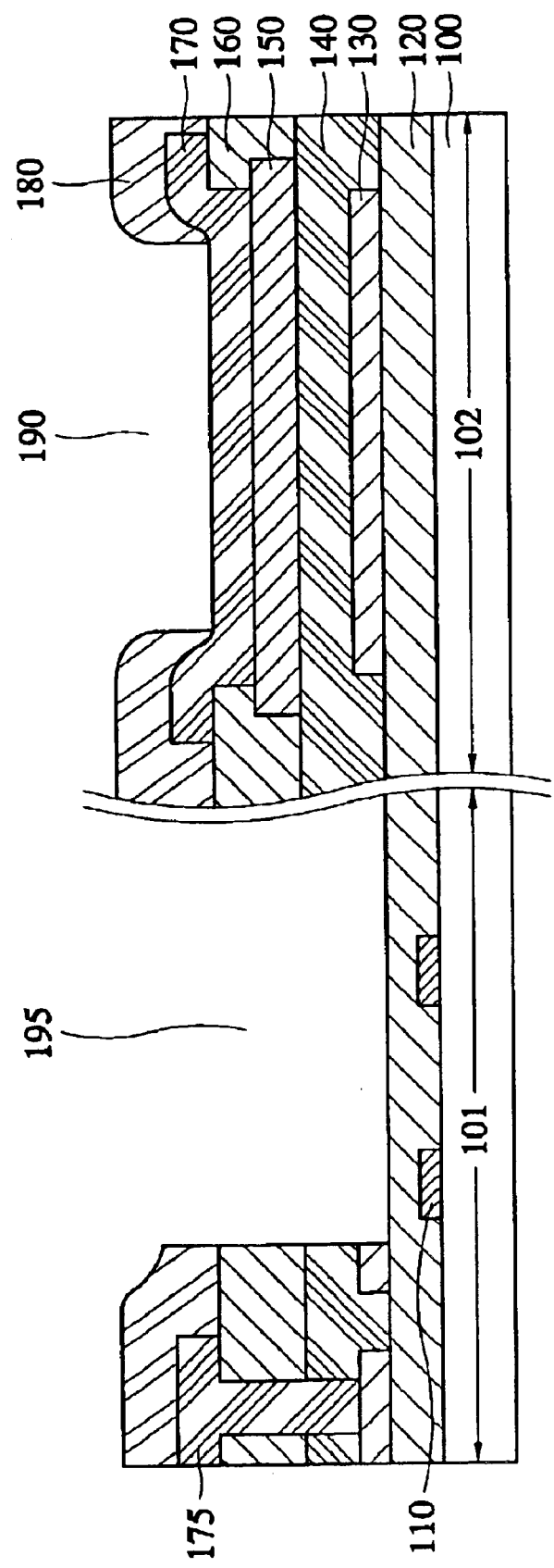

Embodiments of the present invention will now be described more fully with reference to the accompanying drawings, in which preferred embodiments of the invention are shown. The same reference numerals in different drawings represent the same elements.

FIGS. 2A to 2D are cross-sectional views of a semiconductor device illustrating a method of forming a fuse box and a bonding pad in a bonding pad region in accordance with an embodiment of the present invention. FIGS. 2A to 2D illustrate the cross-sectional views taken from a different direction than the views of FIGS. 1A to 1D. In particular, FIGS. 2A to 2D are taken from a longitudinal direction of the fuse and the bonding pad taken along line IId—IId in FIG. 3.

Figure 2A:
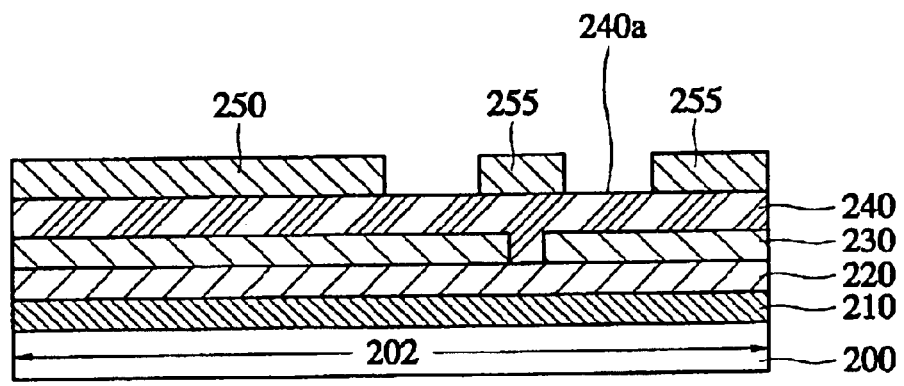
FIGS. 2A to 2D are cross-sectional views of a semiconductor device taken along a line IId—IId in FIG. 3 for showing a method of forming a fuse box and a bonding pad in a bonding pad region in accordance with the present invention.

Referring to FIG. 2A, a plurality of fuses 210 are formed in a bonding pad region 202 of a semiconductor substrate 200. The fuses 210 can be formed of any suitable materials including polysilicon. When a polysilicon layer is patterned in a memory cell region (not shown) to form a bit line, the fuses 210 may be concurrently formed in the bonding pad region 202.

Next, a first interlayer insulating film 220 is formed on the semiconductor substrate 200 including the fuses 210. Then, an etching stop layer 230 is formed on the first interlayer insulating film 220. The etching stop layer 230 is preferably formed of polysilicon and is used as an etching stopper in processes of forming a via hole for a guard ring and forming a fuse box. The etching stop layer 230 may be formed concurrently with formation of a polysilicon layer for a capacitor plate in the memory cell region (not shown).

Figure 2B:
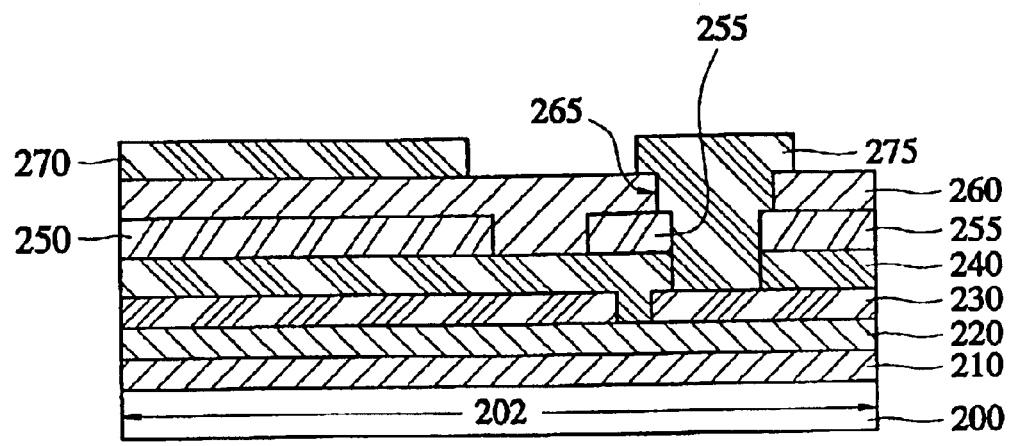

Next, a second interlayer insulating film 240 is formed on the semiconductor substrate 200. Next, a metal layer is formed and patterned on the second interlayer insulating film 240, thereby forming a first metal line 250 and metal patterns 255 on the second interlayer insulation film 240 in the bonding pad region 202. A portion 240a of the second interlayer insulating film 240 is exposed between the metal patterns 255 to define a guard ring 275 (FIG. 2B). A via hole 265 is formed by etching the exposed portion 240a of the second interlayer insulating film 240 in the subsequent guard ring formation process.

As shown in FIG. 2B, a third interlayer insulating film 260 is formed on the metal patterns 255. Then, the third interlayer insulating film 260 and the second interlayer insulating film 240 are etched in the portion 240a until the etching stop layer 230 is exposed, thereby forming the via hole 265. The via hole 265 is formed self-aligned with the metal patterns 255.

Although not shown, concurrently with formation of the via hole 265, an opening (not shown) is formed in the third interlayer insulating film 260 by etching to expose the first metal line 250 over the second metal line 240.

Next, a metal layer is deposited and patterned on the resulting structure, thereby forming a second metal line 270 that contacts the first metal line 250 via the opening (not shown). The second metal line 270 forms a bonding pad. Also, the guard ring 275 is formed in the via hole 265.

Figure 2C:
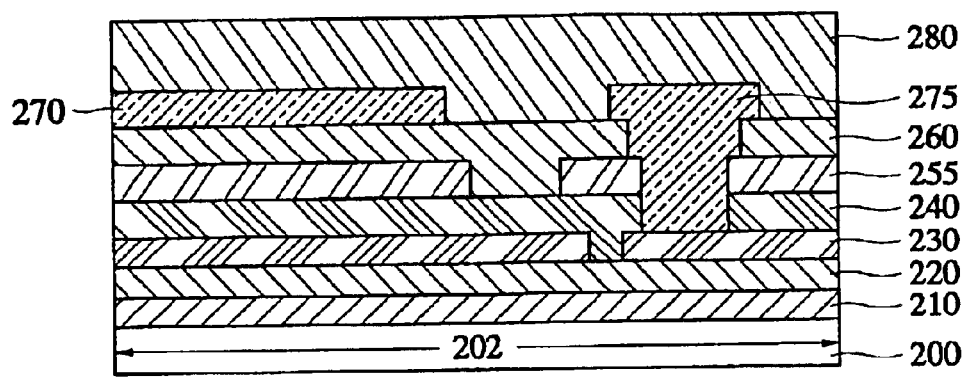

As shown in FIG. 2C, a passivation layer 280 is formed on the resulting structure including the second metal line 270 and the guard ring 275. The passivation layer 280 is preferably comprised of a double layer including a silicon nitride layer and an oxide layer. The silicon nitride layer is preferably formed by a chemical vapor deposition (CVD) process and the oxide layer is preferably formed by a high-density plasma (HDP) deposition process. One skilled in the art will appreciate that other suitable methods can be used to form the silicon nitride layer or the oxide layer.

Figure 2D:
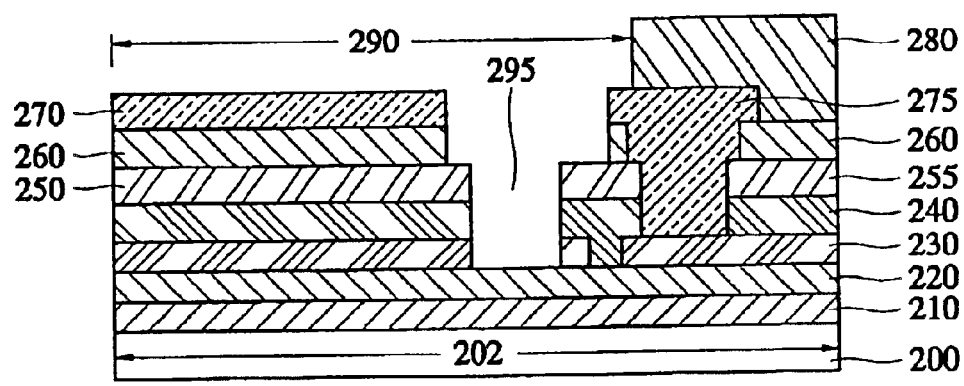

As shown in FIG. 2D, the passivation layer 280 is etched to form a bonding pad opening 290 that exposes the second metal line 270. Exposed portions of the third interlayer insulating film 260 and the second interlayer insulating film 240 between the second metal line 270 and the guard ring 275 are etched until the etching stop layer 230 is exposed. Then, a portion of the etching stop layer 230 is etched to form the fuse box 295 within the bonding pad opening 290.

During etching of the passivation layer 280 to form the bonding pad opening 290, the second metal line 270 and the guard ring 275 act as an etching stopper. The fuse box 295 is formed self-aligned with the second metal line 270 and the guard ring 275 and also with the first metal line 250 and the metal pattern 255.

A distance between the second metal line 270 and the guard ring 275 is formed wider than a distance between the first metal line 250 and the metal pattern 255 so that the area of the fuse box 295 is widely formed.

Further, since the etching stop layer 230 protects the first interlayer insulating film 220 from being etched during formation of the fuse box 295, the thickness of the first interlayer insulating film 220 over the fuse 210 remains substantially uniform.

The guard ring 275 is provided to inhibit moisture from permeating through the fuse box 295. The guard ring 275 preferably protects a side of the fuse box 295 as shown.

Figure 3:
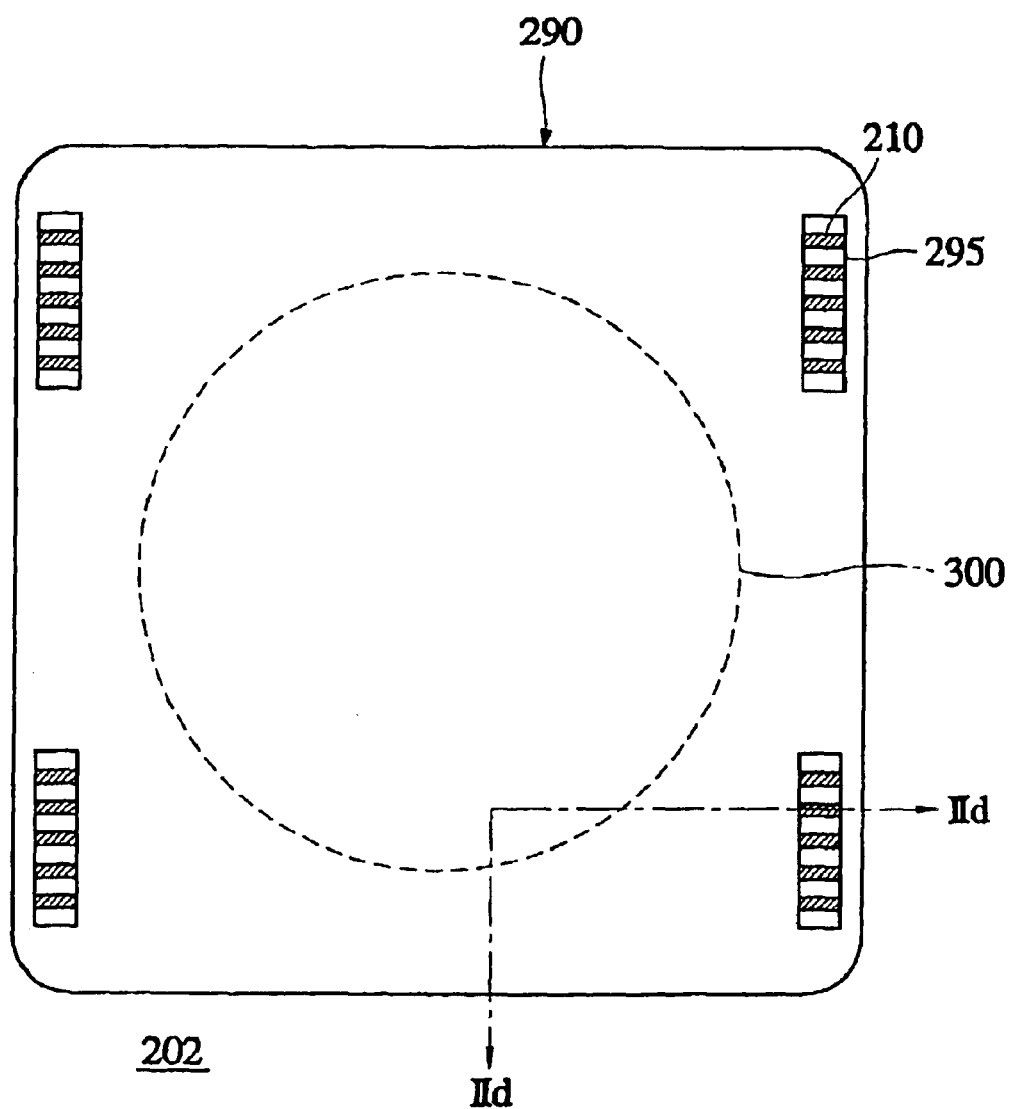
FIG. 3 is a plan view of the bonding pad region of a semiconductor device in which the fuse box is formed in accordance with the present invention.

FIG. 3 illustrates a plan view of the semiconductor device in the bonding pad region formed by the method of FIGS. 2A to 2D according to an embodiment of the present invention.

As shown in FIG. 3, the fuse boxes 295 comprising a plurality of the fuses 210 are formed in the bonding pad opening 290 of the bonding pad region 202. A portion 300 surrounded by the dotted line indicates an area where a wire bonding process is to be performed.

In FIG. 3, the fuse boxes 295 are formed preferably at four corners of the bonding pad opening 290, but the number and position of the fuse boxes 295 are not limited by the number and the position illustrated in FIG. 3.

According to an embodiment of the present invention, although an area for wire bonding may be arranged on the fuse box due to the misalignment, it will not affect the semiconductor device manufacturing. This is because the fuse box is used in a laser repair process before the packaging process.

According to an embodiment of the present invention, the fuse box is preferably formed self-aligned with both of the second metal line and the guard ring, and the first metal line and the metal pattern. However, a person of ordinary skill in the art will understand that other suitable arrangements of the fuse box can be used. For example, the fuse box may be formed self-aligned with the second metal line and the guard ring, or the first metal line and the metal pattern.

The present invention provides a semiconductor device and a manufacturing method thereof capable of reducing a chip size by forming both a fuse box and a bonding pad in a bonding pad region. Thus, the chip size can be efficiently reduced.

Thus, with the present invention, the manufacturing yield can be increased by improving process uniformity at the edge area of a wafer.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device, comprising:
   a plurality of fuses formed in a bonding pad region of a semiconductor substrate;
   an insulation film overlying the plurality of fuses;
   a bonding pad overlying the insulation film in the bonding pad region; and
   a passivation layer overlying the resulting structure and including a bonding pad opening to expose the bonding pad, wherein the bonding pad opening includes a fuse box to expose a portion of the insulation film covering the fuses.

2. The semiconductor device according to claim 1, further comprising a guard ring formed at a side of the fuse box configured to protect the fuse box.

3. A semiconductor device, comprising:
   a plurality of fuses formed in a bonding pad region of a semiconductor substrate;
   a first interlayer insulating film overlying the plurality of fuses;
   a first metal line and metal patterns formed on the first interlayer insulating film in the bonding pad region;
   a second interlayer insulating film overlying the first metal line;
   a second metal line formed on the second interlayer insulating film over the first metal line;
   a passivation layer overlying the resulting structure and including a bonding pad opening to expose the second metal line; and
   a fuse box formed within the bonding pad opening to expose the first interlayer insulating film over the fuses.

4. The semiconductor device according to claim 3, wherein the first metal line and the metal pattern are farmed of the same material.

5. The semiconductor device of claim 3, further comprising a guard ring formed in a via hole extending through the second interlayer insulating film between the metal patterns, the guard ring adjacent the fuse box.

6. The semiconductor device of claim 5, wherein the second metal line and the guard ring are formed of the same material.

7. A semiconductor device, comprising:
   a plurality of fuses formed in a bonding pad region of a semiconductor substrate;
   an insulation film overlying the plurality of fuses; and
   a bonding pad overlying the insulation film in the bonding pad region.

* * * * *

UNITED STATES PATENT AND TRADEMARK OFFICE
CERTIFICATE OF CORRECTION

PATENT NO. : 6,853,050 B2
DATED : February 8, 2005
INVENTOR(S) : Kim

It is certified that error appears in the above-identified patent and that said Letters Patent is hereby corrected as shown below:

Column 6,
Line 15, replace "pattern are farmed of the" with -- pattern are formed of the --.

Signed and Sealed this

Seventh Day of March, 2006

JON W. DUDAS
*Director of the United States Patent and Trademark Office*